United States Patent [19]

Makino et al.

[11] Patent Number: 5,391,260
[45] Date of Patent: Feb. 21, 1995

[54] VACUUM PROCESSING APPARATUS

[75] Inventors: Akitaka Makino; Naoyuki Tamura, both of Kudamatsu; Tetsunori Kaji, Tokuyama, all of Japan

[73] Assignee: Hitachi, Ltd., Tokyo, Japan

[21] Appl. No.: 37,459

[22] Filed: Mar. 26, 1993

[30] Foreign Application Priority Data

Mar. 27, 1992 [JP] Japan .................... 4-070610

[51] Int. Cl.⁶ .......................................... C23C 16/00
[52] U.S. Cl. ................................ 156/646; 156/345; 427/248.1; 118/715
[58] Field of Search ............ 118/715; 156/345, 646; 427/248.1

[56] References Cited

U.S. PATENT DOCUMENTS

| 4,431,473 | 2/1984 | Okano et al. | 156/345 |
| 5,000,225 | 3/1991 | Murdoch | 137/625 |

FOREIGN PATENT DOCUMENTS

405668 1/1991 European Pat. Off. .

Primary Examiner—Richard Bueker
Attorney, Agent, or Firm—Antonelli, Terry, Stout & Kraus

[57] ABSTRACT

To improve an actual exhaust speed, in a vacuum processing device for processing a work located in a vacuum processing chamber by using a processing gas introduced into the vacuum processing chamber, the vacuum processing device having means for introducing the processing gas into the vacuum processing chamber, means for controlling a gas flow of the processing gas, and means for exhausting the processing gas after the work is processed by the processing gas; the exhausting means comprises an exhaust pump, a buffer space extended in a direction substantially perpendicular to a center of the work with an extended area larger than a size of a suction port of the exhaust pump, and a gas outlet formed on a back side of a surface of the work to be processed, the gas outlet having a size substantially equal to or larger than the size of the suction port of the exhaust pump.

12 Claims, 5 Drawing Sheets

VACUUM PROCESSING APPARATUS

BACKGROUND OF THE INVENTION

1. Field of the Invention

The present invention relates to a vacuum processing apparatus, and more particularly to a vacuum processing apparatus suitable for processing such as the etching of a semiconductor wafer or film formation.

2. Description of the Related Art

In a dry etching technique to be used as a microprocessing method for a semiconductor integrated circuit (LSI), a high precision of a 0.1μm level is required in response to an increase in fineness of LSI. Further, high-speed processing is also required with a microprocessing level of 0.8μm, 0.5μm or 0.3μm, while it is also required to reduce a cost of such a dry etching apparatus. However, in a dry etching apparatus as described in Japanese Patent Laid-open Publication No. 6437021, a vacuum processing chamber is not connected directly to an exhaust pump or an exhaust conductance adjusting function.

In the prior art mentioned above, a shortening of an exhaust path is not taken into consideration. That is, a reduction in substantial exhaust conductance is brought about. Accordingly, a large-power or costly exhaust pump is selected, so as to obtain an intended ultimate vacuum in the vacuum processing chamber. In such a large-power exhaust pump, however, a flange diameter of the exhaust pump is large to cause an increase in center distance between the vacuum processing chamber and the exhaust pump, that is, an increase in length of the exhaust path, resulting in a reduction in exhaust conductance. Further, an actual exhaust speed of the exhaust pump is small in the process, so that a selectable range of a processing gas flow is narrow to hinder an improvement in performance. For example, as in an ECR etching device described in "Solid State Devices and Materials", P 207, 1990, etching of polysilicon is performed with $Cl_2$ flow rate of 20 sccm under a low gas pressure of 0.5 mTorr. In this etching, an etching speed of the polysilicon is not greater than 300 nm/min. Further, in etching of Si or $SiO_2$ to form a deep groove such as a trench or a contact hole, an etching speed under such a low gas pressure is too small. Thus, in the prior art etching, it is difficult to obtain a high etching speed under a low gas pressure of 0.5 mTorr or less.

SUMMARY OF THE INVENTION

It is an object of the present invention to provide a vacuum processing apparatus which can improve an actual exhaust speed.

It is another object of the present invention to provide a vacuum processing apparatus wherein an exhaust ability of an exhaust pump is fully derived.

According to the present invention, in a vacuum processing apparatus for processing a sample located in a vacuum processing chamber having a gas inlet through which a processing gas is introduced and a gas outlet through which the processing gas is exhausted by an exhaust pump, a size of the gas outlet being equal to or larger than a size of the suction port of the exhaust pump.

To accelerate an etching reaction between the processing gas and the sample surface, it is necessary to introduce a large amount of the processing gas into the vacuum processing chamber and allow the processing gas to efficiently react with the sample surface, and it is also necessary to exhaust a reaction product which does not contribute to the etching reaction or hinders the etching reaction to the outside of the vacuum processing chamber in a short time. To meet these requirements, it is necessary to increase a pumping speed of the exhaust pump for exhausting the reaction product and increase an exhaust conductance of a gas exhaust path from a gas inlet of the vacuum processing chamber to the suction port of the exhaust pump. According to the present invention having the above construction, the exhaust conductance of the gas exhaust path from the gas inlet of the vacuum processing chamber to the suction port of the exhaust pump can be increased to thereby improve the actual exhaust speed.

DESCRIPTION OF THE PREFERRED EMBODIMENTS

First Preferred Embodiment

A first preferred embodiment of the present invention will be described with reference to FIG. 1.

A wafer 13 as a work to be processed is placed on an upper surface of a work table 12. The work table 12 is located in a vacuum processing chamber 10 so as to be supported from a bottom surface of the chamber 10. A discharge tube 11 formed of quartz is gas-tightly fitted with an upper opening of the vacuum processing chamber 10 so as to be opposed to the upper surface of the work table 12. In this preferred embodiment, an upper surface of the discharge tube 11 is substantially parallel to the upper surface of the work table 12. A plurality of gas inlets 14 are formed through an upper wall of the discharge tube 11. A gas supply pipe 15 is connected at one end thereof to each gas inlet 14, and the other end of the gas supply pipe 15 is connected to a processing gas source (not shown). A gas flow controller 16 is mounted to each gas supply pipe 15 in the course thereof. A gas outlet is formed through a lower side wall of the vacuum processing chamber 10. An exhaust pump 18 is connected through a conductance valve 17 to the gas outlet of the vacuum processing chamber 10. The size of the gas outlet of the vacuum processing chamber 10 and the size of the conductance valve 17 are set to be equal to or larger than the size of a suction port of the exhaust pump 18. A wave guide 19 is so provided as to surround the discharge tube 11. A microwave generator 20 is provided at an upper end of the wave guide 19. A solenoid coil 21 is so provided as to surround a lower portion of the wave guide 19 and the discharge tube 11.

Figure 1:
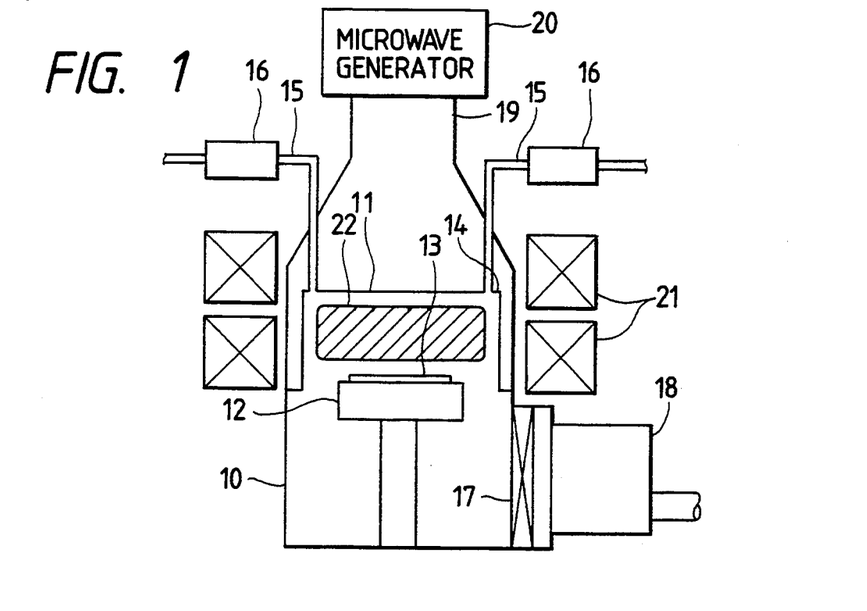
FIG. 1 is a schematic illustration of a vacuum processing apparatus according to a first preferred embodiment of the present invention.

In the vacuum processing apparatus shown in FIG. 1, a processing gas, e.g., an etching gas is introduced into the vacuum processing chamber 10. On the other hand, a high frequency of 2.45 GHz is generated in the microwave generator 20, and is introduced through the wave guide 19 into the discharge tube 11 to thereby generate a gas plasma 22. In order to effect highly efficient discharge, the solenoid coil 21 for generating a magnetic field is provided around the discharge tube 11. For example, a magnetic field of 875 G is generated by the solenoid coil 21 to effect electron cyclotron resonance (ECR) and thereby generate a high-density plasma. The etching gas introduced from the gas inlets 14 becomes the gas plasma 22 in the discharge tube 11. The wafer 13 placed on the work table 12 in the vacuum processing chamber 10 is etched by using the gas plasma 22. After the wafer 13 is processed by the gas plasma 22, a reaction product and other residual gas are allowed to pass through a peripheral space around the work table 12 and flow into a lower portion of the vacuum processing chamber 10, then being exhausted from the gas outlet of the chamber 10 through the conductance valve 17 to the outside of the chamber 10 by the exhaust pump 18.

According to the first preferred embodiment, the gas outlet is formed through the lower side wall of the vacuum processing chamber 10, and the exhaust pump 18 is connected through the conductance valve 17 to the gas outlet. Accordingly, the lower portion of the vacuum processing chamber 10 below the work table 12 can be utilized as a buffer space, so that the uniformity of conductance around the work table 12 can be improved. Further, since the distance between the wafer 13 and the exhaust pump 18 can be reduced, the exhaust conductance can be improved.

Figure 2:
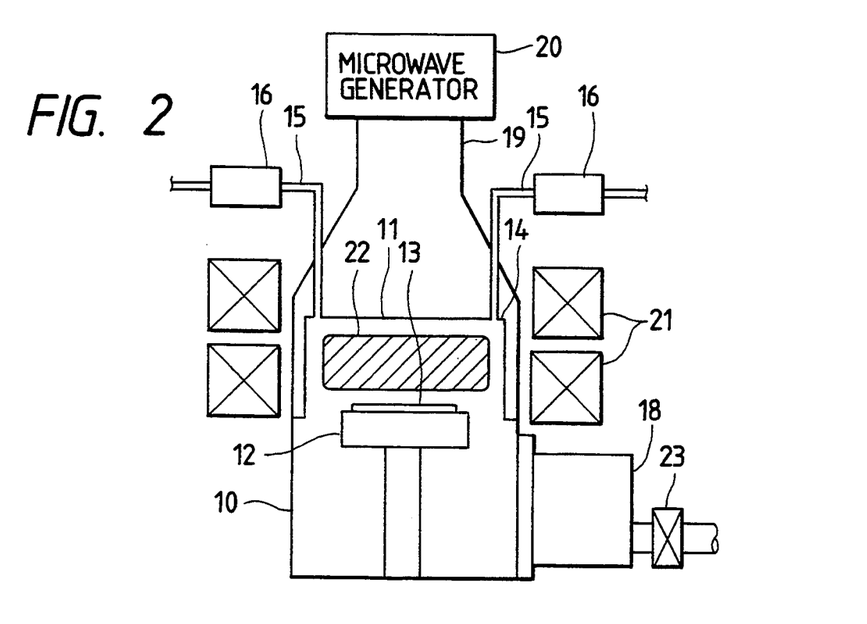
FIG. 2 is a schematic illustration of a vacuum processing apparatus, showing a modification of an exhaust system in the apparatus shown in FIG. 1.

While the exhaust pump 18 is connected through the conductance valve 17 to the gas outlet formed through the lower side wall of the vacuum processing chamber 10 in the first preferred embodiment, the exhaust pump 18 may be connected directly to the gas outlet of the vacuum processing chamber 10, and a conductance valve 23 may be connected to the exhaust pump 18 on the downstream side thereof as shown in FIG. 2. With this construction, the reaction produce and other residual gas generated after processing the wafer 13 are exhausted through the exhaust pump 18 and the conductance valve 23 in this order. Therefore, the volume of a vacuum space to the exhaust pump 18 can be made smaller by the volume in at least the conductance valve 17 than that in the first preferred embodiment, thereby further improving the exhaust conductance.

Second Preferred Embodiment

A second preferred embodiment of the present invention will be described with reference to FIG. 3, in which the same reference numerals as those in FIG. 1 designate the same parts, and the explanation thereof will be omitted hereinafter.

A high-frequency generator 30 is connected to a work table 12 located in a vacuum processing chamber 24. A discharge tube 25 formed of quartz is gas-tightly fitted with an upper opening of the vacuum processing chamber 24 so as to be opposed to the upper surface of the work table 12. A gas outlet is formed through a lower side wall of the vacuum processing chamber 24. In this preferred embodiment, an exhaust pump 18a having an exhaust speed adjusting mechanism (e.g., turbo molecular pump of a rotational speed variable type) is connected directly to the gas outlet of the vacuum processing chamber 24. The size of the gas outlet of the vacuum processing chamber 24 is set to be equal to or larger than the size of a suction port of the exhaust pump 18a. A loop antenna 26 is wound around the discharge tube 25, and a high-frequency generator 27 is connected to the loop antenna 26. A solenoid coil 28 is provided around the loop antenna 26 and an upper portion of the vacuum processing chamber 24.

Figure 3:
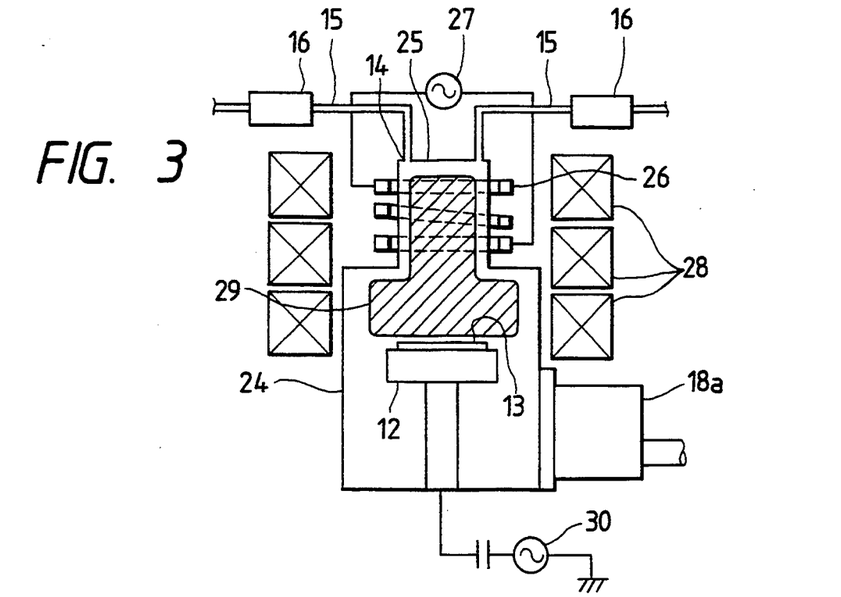
FIG. 3 is a schematic illustration of a vacuum processing apparatus according to a second preferred embodiment of the present invention.

In the vacuum processing apparatus shown in FIG. 3, a processing gas, e.g., an etching gas is introduced from gas inlets 14 into the discharge tube 25. On the other hand, a high frequency of 2-70 MHz is applied to the loop antenna 26 by the high-frequency generator 27 to thereby generate a gas plasma 29 in the discharge tube 25. At this time, the gas plasma 29 is generated also in the upper portion of the vacuum processing chamber 24 as a high-density plasma by the solenoid coil 28 for generating a magnetic field. A wafer 13 placed on the work table 12 located in the vacuum processing chamber 24 is processed by the gas plasma 29. Thereafter, a reaction product and other residual gas are allowed to pass through a peripheral space around the work table 12 and flow into a lower portion of the vacuum processing chamber 24, then being exhausted from the gas outlet to the outside of the chamber 24 by the exhaust pump 18a.

According to the second preferred embodiment, the same effect as that of the first preferred embodiment can be obtained, and additionally the volume of a vacuum space to the exhaust pump 18a can be made smaller by the volume in at least the conductance valve 17 than that in the first preferred embodiment to thereby improve the exhaust conductance. Further, since the loop antenna 26 is provided around the discharge tube 25 to generate the discharge, the size of the discharge tube 25 can be arbitrarily set according to the size of the wafer 13.

Figure 4:
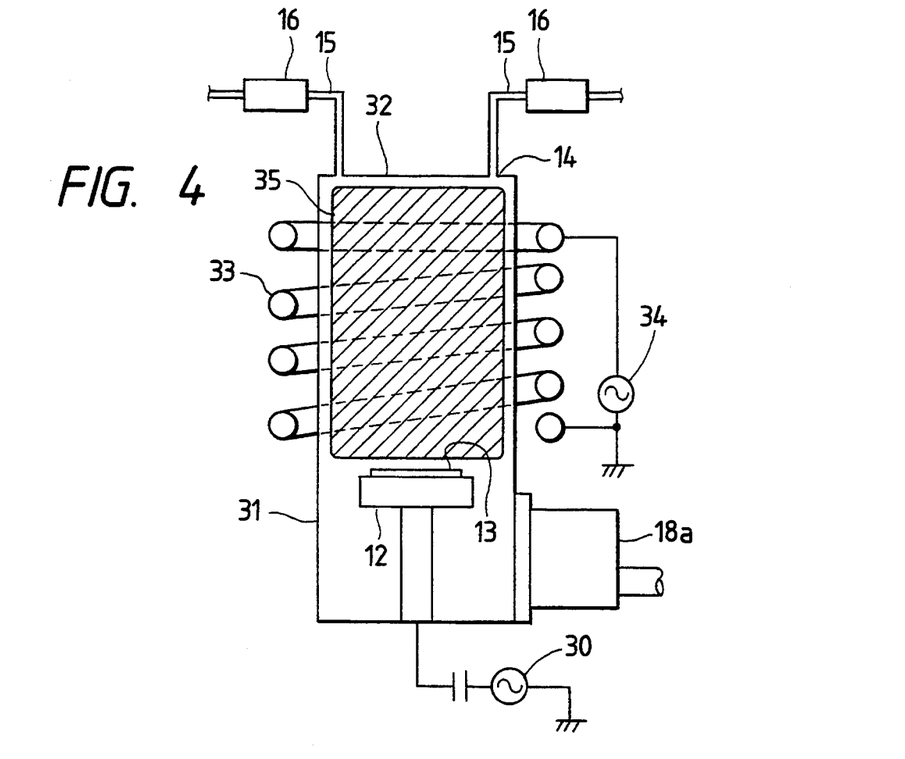
FIG. 4 is a schematic illustration of a vacuum processing apparatus, showing a modification of plasma generating means in the apparatus shown in FIG. 3.
Figure 5:
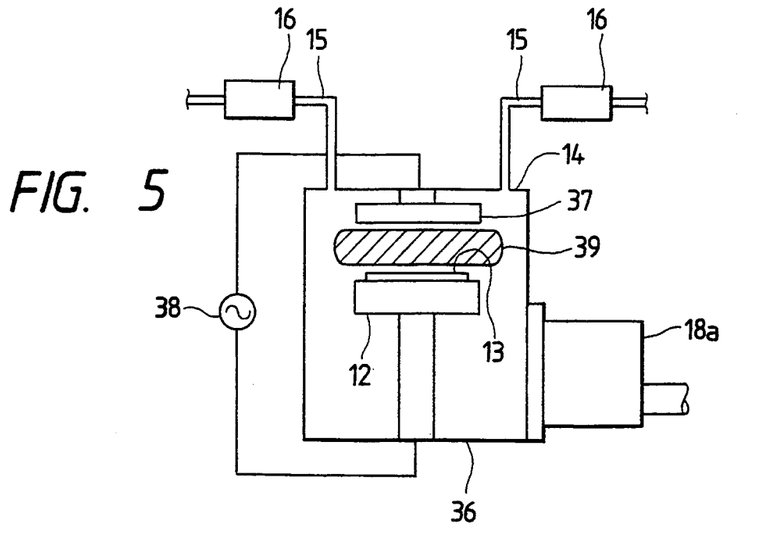
FIG. 5 is a schematic illustration of a vacuum processing apparatus, showing another modification of the plasma generating means in the apparatus shown in FIG. 3.

While the gas plasma 29 is generated by the loop antenna 26 and the solenoid coil 28 in the second preferred embodiment, a helical coil or parallel flat plate electrodes may be used without utilizing a magnetic field as shown in FIG. 4 or 5.

FIG. 4 shows a vacuum processing apparatus using a helical coil 33. The helical coil 33 is provided around a discharge tube 32 constituting an upper portion of a vacuum processing chamber 31. A high-frequency generator 34 is connected to the helical coil 33. A processing gas is introduced from gas inlets 14 into the discharge tube 32, and the vacuum processing chamber 31 is evacuated to a predetermined pressure by an exhaust pump 18a. On the other hand, a high-frequency power is applied to the helical coil 33 by the high-frequency generator 34. Accordingly, a gas plasma 35 is generated in the discharge tube 32, and a wafer 13 placed on a work table 12 located in the vacuum processing chamber 31 is processed by the gas plasma 35.

FIG. 5 shows a vacuum processing apparatus using parallel flat plate electrodes. A work table 12 as a lower electrode is located in a vacuum processing chamber 36 so as to be supported from a bottom surface of the chamber 36, and an upper electrode 37 is located in the chamber 36 so as to be supported from a top surface of the chamber 36 and be exposed to the work table 12. A high-frequency generator 38 is connected to both the work table 12 and the upper electrode 37. A processing gas is introduced from gas inlets 14 into the vacuum processing chamber 36, and the chamber 36 is evacuated to a predetermined pressure by an exhaust pump 18a. On the other hand, a high-frequency power is applied across the work table 12 and the upper electrode 37 by the high-frequency generator 38. Accordingly, a gas plasma 39 is generated in the space between the work table 12 and the upper electrode 37 in the chamber 36, and a wafer 13 placed on the work table 12 is processed by the gas plasma 39.

Third Preferred Embodiment

A third preferred embodiment of the present invention will be described with reference to FIG. 6, in which the same reference numerals as those in FIG. 1 designate the same parts, and the explanation thereof will be omitted hereinafter. The third preferred embodiment differs from the first preferred embodiment in the point that a uniforming plate 40 is provided between an inner wall of a vacuum processing chamber 10 and an outer periphery of a work table 12. The uniforming plate 40 is formed with a plurality of through holes having different sizes. The different sizes of the through holes are so set as to gradually increase from the position nearest to an exhaust pump 18 to the position farthest from the exhaust pump 18.

Figure 6:
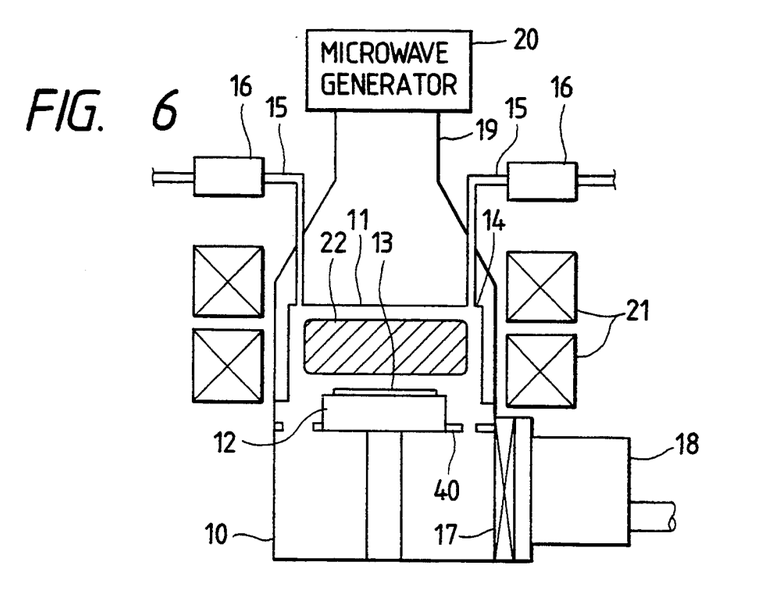
FIG. 6 is a schematic illustration of a vacuum processing apparatus according to a third preferred embodiment of the present invention.

In the vacuum processing apparatus shown in FIG. 6, after a wafer 13 is processed by a gas plasma 22, a reaction product and other residual gas are allowed to pass through the through holes of the uniforming plate 40 around the work table 12 and flow into a lower portion of the vacuum processing chamber 10, then being exhausted from a gas outlet of the chamber 10 through a conductance valve 17 to the outside of the chamber 10 by the exhaust pump 18.

According to the third preferred embodiment, the same effect as that of the first preferred embodiment can be obtained, and additionally the conductance around the work table 12 can be kept uniform. Furthermore, the uniformity of processing can be further improved.

Figure 7:
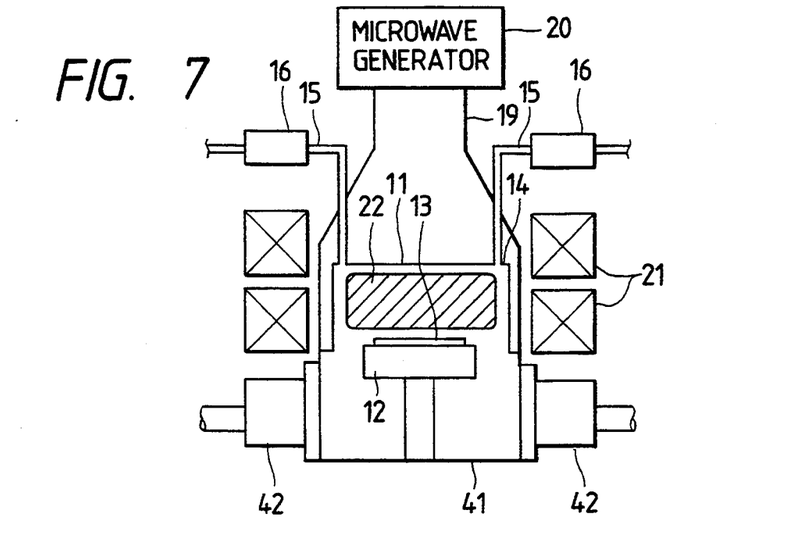
FIG. 7 is a schematic illustration of a vacuum processing apparatus, showing a modification of an exhaust system in the apparatus shown in FIG. 3.

In the first to third preferred embodiments mentioned above, the exhaust pump is provided on one side wall of the vacuum processing chamber. This location of the exhaust pump will cause a deviation of gas flow upon evacuation of the chamber. To cope with this deviation, the buffer space is defined in the lower portion of the chamber below the work table to thereby improve the uniformity of processing in the first to third preferred embodiments. Especially, in the third preferred embodiment, the uniformity of processing is further improved by providing the uniforming plate 40. In modification as shown in FIG. 7, a pair of exhaust pumps 42 may be provided on the opposite lower side walls of a vacuum processing chamber 41, so as to eliminate the deviation of gas flow upon evacuation of the chamber 41. Each exhaust pump 42 is constructed as an exhaust pump having an exhaust speed adjusting mechanism (e.g., turbo molecular pump of a rotational speed variable type).

Fourth Preferred Embodiment

Figure 8:
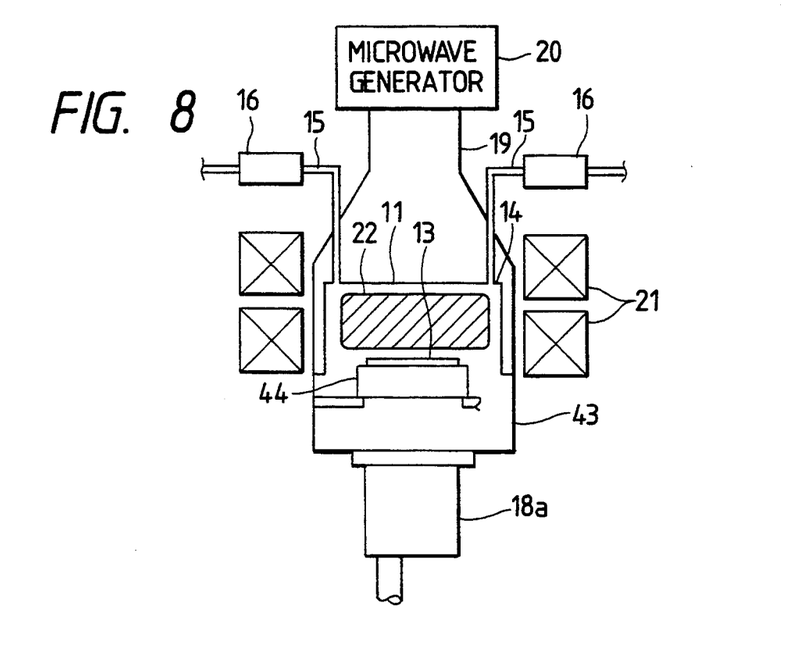
FIG. 8 is a schematic illustration of a vacuum processing apparatus according to a fourth preferred embodiment of the present invention.

A fourth preferred embodiment of the present invention will be described with reference to FIG. 8, in which the same reference numerals as those in FIG. 1 designate the same parts, and the explanation thereof will be omitted hereinafter. The fourth preferred embodiment differs from the first preferred embodiment in the point that a work table 44 is supported from a side wall of a vacuum processing chamber 43 and that a gas outlet connected to an exhaust pump 18a is formed through a bottom wall of the chamber 43 at a substantially central position thereof in opposed relationship to the work table 44. With this construction, after a wafer 13 is processed by a gas plasma 22, a reaction product and other residual gas are allowed to pass through a peripheral space around the work table 44 and flow into a lower portion of the vacuum processing chamber 43, then being exhausted from the gas outlet to the outside of the chamber 43 by the exhaust pump 18a.

According to the fourth preferred embodiment, the gas outlet is formed through the bottom wall of the vacuum processing chamber 43 in opposed relationship to the work table 44, and the exhaust pump 18a is connected to the gas outlet of the chamber 43. Accordingly, gas flow in the periphery of the work table 44 can be made uniform to improve the uniformity of conductance around the work table 44 and improve the uniformity of processing. Furthermore, the distance between the wafer 13 and the exhaust pump 18a can be made smaller than that in the first preferred embodiment to thereby further improve the exhaust conductance.

Figure 9:
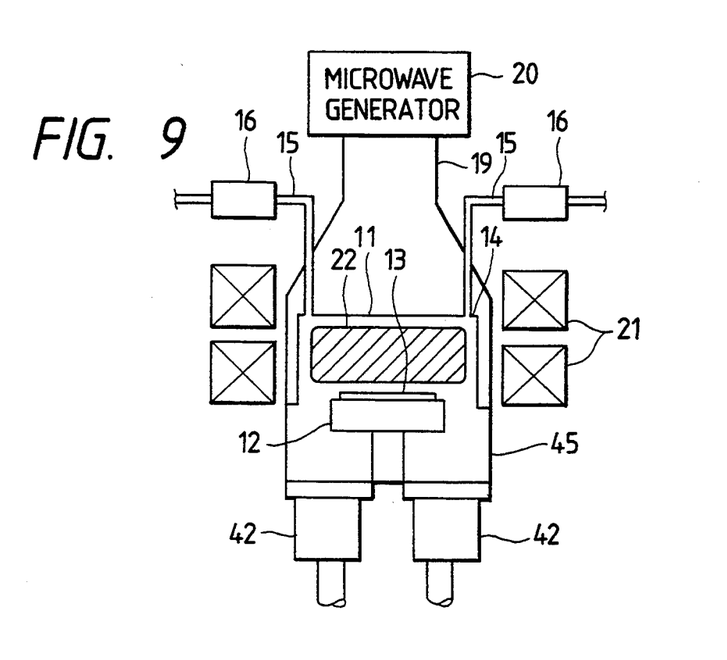
FIG. 9 is a schematic illustration of a vacuum processing apparatus, showing a modification of an exhaust system in the apparatus shown in FIG. 8.

While the exhaust pump 18a is connected to the gas outlet formed at a substantially central position of the bottom wall of the vacuum processing chamber 43 in the fourth preferred embodiment, a modification as shown in FIG. 9 may be made. In this modification, a work table 12 is supported from a bottom surface of a vacuum processing chamber 45 at a central position thereof, and a plurality of gas outlets are formed through a bottom wall of the chamber 45 in symmetrical relationship with each other with respect to a center line of the work table 12. A plurality of exhaust pumps 42 are connected to the gas outlets of the chamber 45, respectively.

Fifth Preferred Embodiment

A fifth preferred embodiment of the present invention will be described with reference to FIG. 10, in which the same reference numerals as those in FIG. 1 designate the same parts, and the explanation thereof will be omitted hereinafter. The fifth preferred embodiment differs from the first preferred embodiment in the point that a bottom wall of a vacuum processing chamber 46 is inclined at a given angle, e.g., at 45 degrees on the opposite sides of a work table 12 to form a pair of inclined bottom wall portions and that a gas outlet is formed through one of the inclined bottom wall portions of the chamber 46 and an exhaust pump 18a is connected to the gas outlet.

Figure 10:
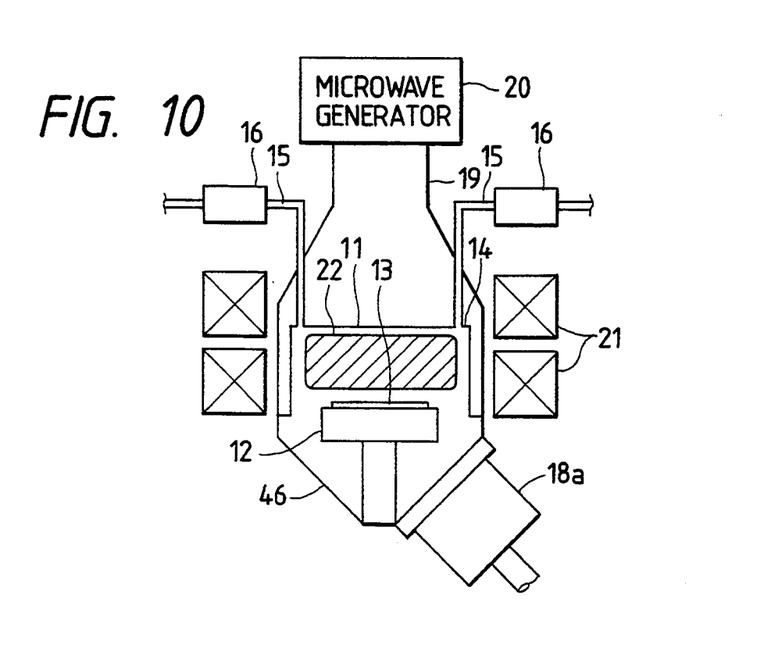
FIG. 10 is a schematic illustration of a vacuum processing apparatus according to a fifth preferred embodiment of the present invention.

In the vacuum processing apparatus shown in FIG. 10, after a wafer 13 is processed by a gas plasma 22, a reaction product and other residual gas are allowed to pass through a peripheral space around the work table 12 and flow into a lower portion of the vacuum processing chamber 46. Then, a part of the reaction product and other residual gas is allowed to flow directly toward the exhaust pump 18a, and the other is reflected on the other inclined bottom wall portion of the chamber 46 to then flow toward the exhaust pump 18a. Thus, all of the reaction product and other residual gas are exhausted from the gas outlet to the outside of the chamber 46 by the exhaust pump 18a.

According to the fifth preferred embodiment, the bottom wall of the vacuum processing chamber 46 is inclined to form the two inclined bottom wall portions, and the exhaust pump 18a is provided on one of the inclined bottom wall portions. Accordingly, the gas is allowed to smoothly flow toward the exhaust pump 18a, and the deviation of gas flow around the work table 12 can be reduced. Furthermore, the distance between the wafer 13 and the exhaust pump 18a can be reduced to thereby improve the exhaust conductance.

According to the first to fifth preferred embodiments mentioned above, a gas exhaust path from the wafer surface to be processed and the suction port of the exhaust pump can be shortened to thereby improve the exhaust conductance of the gas exhaust path. Accordingly, a large amount of processing gas can be introduced into the vacuum processing chamber to make the gas plasma to efficiently react with the wafer surface, and a reaction product which does not contribute to the etching reaction or hinders the etching reaction can be exhausted out of the vacuum processing chamber in a short time. Thus, the etching reaction between the gas plasma and the wafer surface can be accelerated to thereby realize high-speed etching. Further, since the exhaust conductance of the gas exhaust path from the wafer surface to the suction port of the exhaust pump is large, a pumping power of the exhaust pump can be reduced to thereby reduce the cost of an exhaust system.

According to the present invention, a gas exhaust path from a gas inlet of a vacuum processing chamber to a suction port of an exhaust pump can be shortened. Accordingly, the exhaust conductance of the gas exhaust path can be improved to thereby improve an actual exhaust speed.

We claim:

1. A vacuum processing apparatus comprising:
   a vacuum processing chamber having a gas inlet and a gas outlet for processing a sample located therein by using a processing gas introduced through said gas inlet; and
   an exhaust pump having a suction port coupled to said gas outlet of said vacuum processing chamber for exhausting said processing gas introduced into said vacuum processing chamber, a cross-sectional area of said suction port of said exhaust pump being not larger than a cross-sectional area of said gas outlet of said vacuum processing chamber.

2. A vacuum processing apparatus according to claim 1, wherein said suction port of said exhaust pump is directly connected to said gas outlet of said vacuum processing chamber.

3. A vacuum processing apparatus according to claim 2, wherein there is provided a conductance valve at an output port of said exhaust pump.

4. A vacuum processing apparatus according to claim 3, wherein a cross-sectional area of said conductance valve is not larger than a cross-sectional area of said output port of said exhaust pump.

5. A vacuum processing apparatus according to claim 1, wherein said suction port of said exhaust pump is connected to said gas outlet of said vacuum processing chamber through a conductance valve, and wherein a cross-sectional area of said conductance valve is not larger than said cross-sectional area of said gas outlet of said vacuum processing chamber and is not smaller than said cross-sectional area of said suction port of said exhaust pump.

6. A vacuum processing apparatus for processing a sample in a vacuum processing chamber by a processing gas comprising:
   a means for introducing said processing gas into said vacuum processing chamber through a gas inlet provided in a wall of said vacuum processing chamber above a top surface of said sample disposed therein;
   a means for controlling a gas flow of said processing gas; and
   an exhaust pump for exhausting said processing gas from said vacuum processing chamber through a gas outlet provided in a side wall of said processing chamber at a location beneath a back surface of said sample disposed therein, said exhaust pump having a suction port connected to said gas outlet, a cross-sectional area of said suction port of said exhaust pump being not larger than a cross-sectional area of said gas outlet of said vacuum processing chamber.

7. A vacuum processing apparatus for processing a sample located in a vacuum processing chamber by using a processing gas introduced into said vacuum processing chamber, said vacuum processing apparatus having:
   a means for introducing said processing gas into said vacuum processing chamber,
   a means for controlling a gas flow of said processing gas, and
   a means for exhausting said processing gas after said sample is processed by said processing gas;
   said means for exhausting comprising an exhaust pump having a suction port, a buffer space extended in a direction below a back surface of said sample, a gas outlet provided in a wall of said processing chamber at a location beneath said sample to be processed, said gas outlet having a cross-sectional area equal to a cross-sectional area of said section port of said exhaust pump, and a means provided between said sample and said exhaust pump for uniforming a conductance of a processing gas flow around said sample.

8. A vacuum processing apparatus for processing a sample located in a vacuum processing chamber by using a processing gas introduced into said vacuum processing chamber, said vacuum processing device having:
   a means for introducing said processing gas into said vacuum processing chamber,
   a means for controlling a gas flow of said processing gas, and
   a means for exhausting said processing gas after said sample is processed by said processing gas;
   said means for exhausting comprising a plurality of exhaust pumps each having a suction port, a buffer space extended in a direction below said sample, and a plurality of gas outlets provided in at least one wail of said processing chamber at locations beneath said sample to be processed, each of said gas outlets having a cross-sectional area substantially equal to or larger than a cross-sectional area of said suction port of a corresponding exhaust pump connected thereto.

9. A vacuum processing apparatus for processing a work located in a vacuum processing chamber by using a processing gas introduced into said vacuum processing chamber, said vacuum processing device having:
a means for introducing said processing gas into said vacuum processing chamber,
a means for controlling a gas flow of said processing gas, and
a means for exhausting said processing gas after said sample is processed by said processing gas;
said means for exhausting comprising a plurality of exhaust pumps, and a plurality of gas outlets provided in a wall of said processing chamber at a location beneath said sample to be processed and arranged in parallel relationship to the surface of said sample and in symmetrical relationship to each other with respect to a center line of said sample, each of said gas outlets having a cross-sectional area substantially equal to or larger than a cross-sectional area of a suction port of a corresponding exhaust pump connected thereto.

10. A vacuum processing method for a vacuum processing apparatus having a vacuum processing chamber and an exhaust pump for exhausting a used gas from said vacuum processing chamber, comprising the steps of:
introducing a processing a gas into said vacuum processing chamber;
treating a sample disposed in said vacuum processing chamber by use of an introduced said processing gas; and
after the step of treating, exhausting a used said processing gas from said vacuum processing chamber through an outlet provided in a wail in said vacuum processing chamber using said exhaust pump having a suction port with a cross-sectional area which is equal to or smaller than a cross-sectional area of said outlet of said vacuum processing chamber.

11. A vacuum processing apparatus according to claim 1, wherein a location of said gas outlet is displaced from a center axis of said vacuum processing chamber.

12. A vacuum processing apparatus according to claim 1, wherein said exhaust pump is directly connected to said gas outlet of said vacuum processing chamber without use of an exhaust conduit.

* * * * *